United States Patent [19]

Erickson

[11] 4,024,750

[45] May 24, 1977

[54] FREQUENCY TUNING SYSTEM WITH VISUAL DISPLAY

[75] Inventor: Bruce G. Erickson, Santa Clara, Calif.

[73] Assignee: American Micro-systems, Inc., Santa Clara, Calif.

[22] Filed: May 19, 1975

[21] Appl. No.: 578,606

[52] U.S. Cl. .......... 73/6; 324/82
[51] Int. Cl.[2] .......... G04D 7/12; G01R 23/12
[58] Field of Search .......... 73/6; 324/82

[56] References Cited

UNITED STATES PATENTS

| | | | |
|---|---|---|---|
| 2,178,074 | 10/1939 | Jakel et al. | 73/6 UX |
| 2,426,721 | 9/1947 | Adams | 324/82 X |
| 2,535,304 | 12/1950 | Lindborg | 73/6 |

FOREIGN PATENTS OR APPLICATIONS

| | | | |
|---|---|---|---|
| 496,666 | 12/1938 | United Kingdom | 73/6 |

OTHER PUBLICATIONS

*Data File 10: How to Use WWV* Shasta Div., Beckman Instr. Inc. p. 5. July 1, 1959.

*Primary Examiner*—S. Clement Swisher
*Attorney, Agent, or Firm*—Owen, Wickersham & Erickson

[57] ABSTRACT

A visual tuning-aid system for aligning an electronic timepiece to a correct reference frequency is disclosed. A reference oscillator in the system provides a reference signal at a precisely fixed predetermined frequency which is, or is converted to, the correct alignment frequency for the timepiece. A sensor electrostatically detects a time base signal in the timepiece and a bandpass amplifier removes any extraneous signals. The reference signal and the time base signal are provided to a phase shift indicating device in the system which provides a visual display, the movement of which is proportional to the rate of phase change between the reference signal and the time base signal. Alignment of the timepiece to the correct frequency stops the phase change and thereupon the visual display stops moving.

2 Claims, 7 Drawing Figures

FREQUENCY TUNING SYSTEM WITH VISUAL DISPLAY

BACKGROUND OF THE INVENTION

The present invention relates to an electronic visual display test apparatus, and more particularly it relates to a test instrument providing a visual motion display which becomes stationary when the frequency of an electronic time-piece is adjusted to coincide with a calibration frequency generated within the apparatus.

Electronic timepieces, particularly digital-display electronic watches, utilize either continuous or intermittent digital time displays driven by a time signal. This signal is derived by frequency divider circuits driven from a timebase signal generator controlled by a quartz crystal. The crystal frequency may be at any one of a number of frequencies. Typically, frequencies utilized by watch designers are selected to coincide with an integral power of the base two. For instance, one commonly used frequency is 32,768 hertz (or $2^{15}$hz) and another is 4,194,304 hertz (or $2^{22}$hz). The selection of a time base frequency must take into account two factors: one, the universal time period for all timepieces is 1 second, and two, crystal tolerances are best controlled in a range from about $2^{15}$ to $2^{22}$ hz.

Certain crystalline materials when subjected to the influence of an electric field, tend to vibrate at a periodic rate, commonly known as the resonant frequency. These vibrations have long been used in crystal oscillator circuits to control the frequency of the oscillator because the crystal presents a very low impedance feedback path to the oscillator at precisely its resonant frequency. The intrinsic resonant frequency of a crystal typically varies slightly from crystal to crystal because of a number of factors which cannot be completely controlled such as physical size. However, the resonant frequency of any crystal can be made to vary slightly by addition and subtraction of capacitance. Consequently, electronic timepieces using the time-base crystal oscillators routinely provide a small trimmer capacitor to enable tuning of the crystal to a precise desired frequency which can be used to control circuitry to drive an accurate time display. The present invention provides a visual tuning-aid that makes possible a rapid and precise alignment of the trimmer capacitor of an electronic timepiece, such as a digital wristwatch.

Heretofore, adjustment of the trimmer capacitor was accomplished primarily with a precision digital frequency counter capable of displaying at least five and sometimes many more digits of different numbers representing the frequency or period of the time-base signal generator of a timepiece to be aligned. Use of those frequency counters, especially in production line situation resulted in eyestrain and undue operator fatique. Impermissable calibration errors naturally resulted. In addition, each digital frequency counter tended to be very expensive because of the substantial costs of precision master oscillators which were required and contained in each such counter. In addition, reading the required digits of such a counter caused the operator to spend a substantial amount of time for each timepiece undergoing calibration. Thus, production rates were slow because of delays at the calibration station, a drawback only overcome by increasing the number of such stations. These and other disadvantages are overcome by the present invention.

In use, electronic timepieces from time to time require readjustment of the frequency generator element. Typically, such recalibration is required after the timepiece is dropped or otherwise jarred or subjected to severe mechanical shock. Such shock tends to realign the quartz crystal or causes it to vibrate at a slightly different resonant frequency which has thereby necessitated recalibration. Thus, in addition to an initial precise calibration, the trimmer capacitor provides a recalibration mechanism for setting the crystal oscillator of electronic timepieces from time to time as the need arises. It is consequently important that the trimmer capacitor provide a sufficient tuning range on both sides of the precisely desired frequency so that subsequent adjustments can be performed either up or down as may be required in a particular timepiece. Heretofore, as with the initial calibration of the trimmer, its recalibration was also accomplished with a digital counter having the drawbacks already mentioned. This problem is also overcome by the present invention.

With greatly increased production and use of electronic timepieces having trimmer capacitors for precise calibration, a need arose for a simple, inexpensive and reliable calibration tool that field repair stations and jewelers can utilize for field recalibration of electronic timepieces. Heretofore, no simple test apparatus was available to field stations and jewelers. Again, the apparatus of the present invention fills that need.

In view of the foregoing, it is an object of the present invention to provide a simple visual indication system enabling rigid, precise calibration of electronic timepieces to a correct frequency as well as determination of the tuning range of such timepieces.

Another object of the present invention is to provide a tuning-aid system for electronic timepieces in which an unmistakable moving visual display ceases to move when the timepiece is adjusted precisely to the correct frequency.

It is a further object of the present invention to provide a visual tuning-aid system for electronic timepieces which may supply multiple tuning stations with a calibration frequency signal which is closely set to a reference signal broadcast by the National Bureau of Standards or other primary frequency standard.

Yet another object of the present invention is to provide a simple and inexpensive visual tuning-aid test instrument for use by electronic timepiece service stations and jewelers for field calibration of electronic timepieces to a correct frequency.

BRIEF DESCRIPTION OF THE INVENTION

The foregoing and other objects are accomplished by a visual tuning-aid system for calibrating electronic timepieces to a correct frequency which includes a reference oscillator, a sensor adapted to pick up and amplify a time based signal from a timepiece to be calibrated, and a display device. The reference oscillator may operate at a predetermined frequency which is the same as, or integrally related to, the correct frequency for the timepiece.

In the preferred embodiments of the present invention, signals derived from the reference oscillator are combined with signals derived from the sensed time-base signal generator of a timepiece to be aligned. The combined signals are used to drive the display device in a way which provides a movement display, such as a spot moving in a circular path, or a rotating indicator needle, indicative of the rate of change of phase of the timepiece signal generator relative the signal from the reference oscillator when the timepiece generator frequency is above or below the correct frequency. When the generator frequency is tuned to the correct reference frequency, phase shift therebetween ceases and the display stops movement indicating precise alignment of the timepiece.

In one embodiment herein, the display device comprises a cathode ray tube wherein the phase-shifted drive signals are generated from the reference signal and are applied to vertical and horizontal deflection plates to produce a unitary lissajous trace. The sensor output is shaped into a sharp pulse. The sharp pulses are applied to a control grid element of the CRTs for modulating electron beam emission from the cathode. The signal from the timepiece is displayed as a spot on the lissajous trace, with the spot rotating along the trace in either one direction or the other until the timepiece oscillator has been calibrated to coincide with the reference frequency whereupon the spot becomes stationary.

In another embodiment of the present invention phase shifted reference signals and phase shifted sensed signals are simultaneously applied to a small three phase motor driving an indicator needle wherein integration of the rate of change of the signals causes the motor to rotate the indicator needle until the sensed signal from the timepiece is adjusted to coincide with the reference signal whereupon the motor ceases to rotate the needle and the indicator becomes stationary.

The tuning-aid system may include two other output reference signals which are each offset from the precise calibration frequency by a predetermined amount above and below. Each offset signal is momentarily switched to the display device for checking the tuning range of the trimmer capacitor in the timepiece during production testing and alignment.

Other objects, advantages and features of the invention will become apparent from the following detailed description of the embodiments presented in conjunction with the accompanying drawings.

DESCRIPTION OF THE EMBODIMENTS

Figure 1:
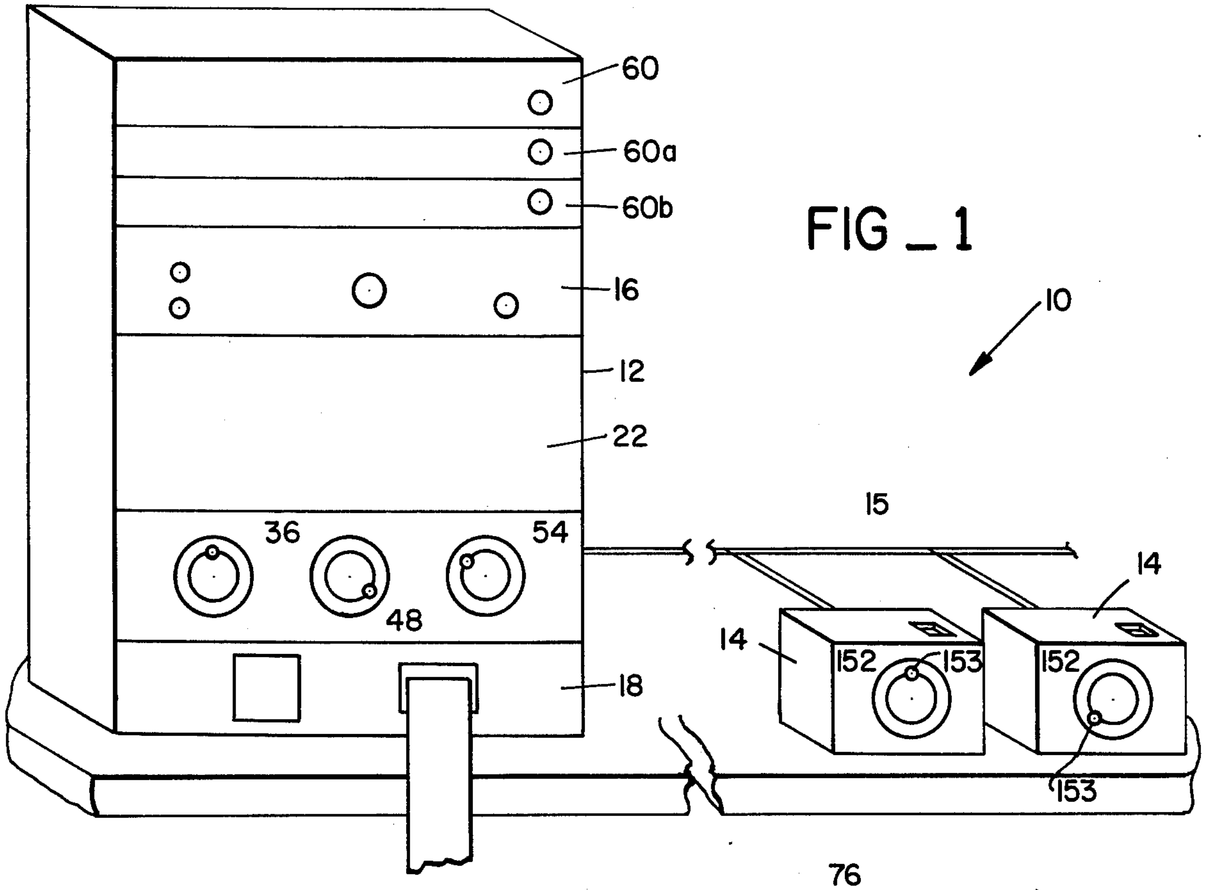
FIG. 1 is a view in perspective of one embodiment of a visual tuning-aid system of the present invention including a master station and two remote operator tuning stations.

With reference to the drawings, FIG. 1 illustrates a production line visual tuning-aid system 10 embodying the principles of the present invention, suitable for use in a factory. The system 10 includes a master station 12 and two identical operator tuning stations 14 which are connected by cables 15 to receive reference signals generated in the master station 12.

The master station includes a ten megahertz reference standard oscillator 16 which may be a commercially available component, such as a Hewlett-Packard model 5087A master oscillator. A very low frequency (VLF) receiver 18 is also provided; it is turned to standard frequency broadcasts at sixty kilohertz (60khz) of the National Bureau of Standards station WWVB. The receiver 18 also includes a chart recorder 20 which is connected to the reference oscillator 16 and to the receiver for a comparison in a permanent record format of the frequency of the standard oscillator 16 with the 60khz frequency of WWVB. A meter can also provided to facilitate precise alignment of the oscillator 16 to the broadcast standard frequency.

Figure 2:
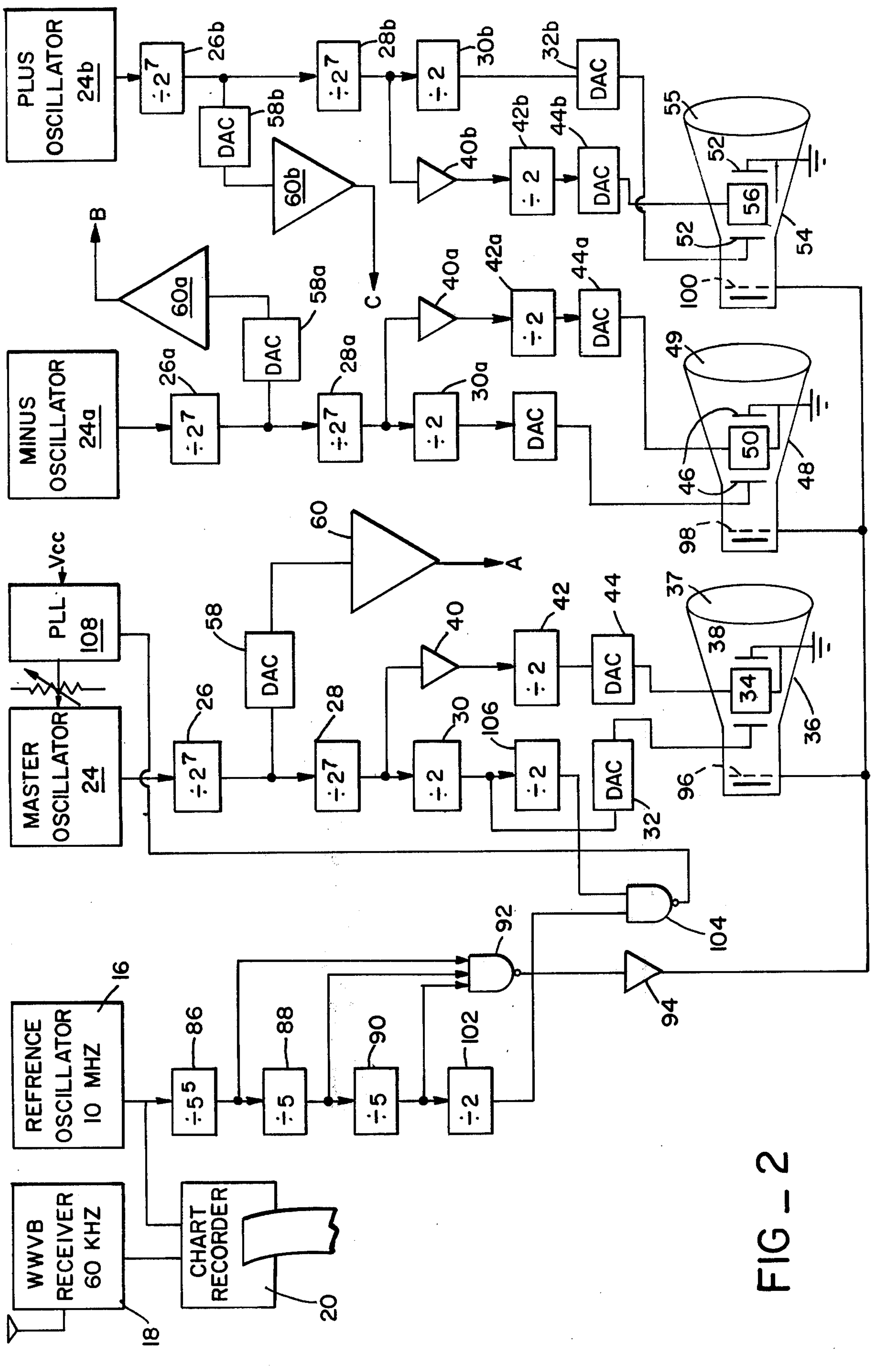
FIG. 2 is a block diagram of the circuitry of the master station of FIG. 1.

The master station 12 also includes a digital processer unit 22. This digital unit is best explained by reference to the block diagram of FIG. 2: it includes a master oscillator 24 operating at 4.194304 megahertz, a minus oscillator **24*a* operating at the same frequency minus ten parts per million and a plus oscillator 24*b*** operating at the same frequency plus ten parts per million. These oscillators are identical in circuitry.

Digital counters 26, 28 and 30 are chain-connected to the output of the master oscillator 24 so that the reference frequency of 4.194304 megahertz is divided first to 32,768 hertz by the counter 26 and is then divided to 128 hertz by counters 28 and 30. The 128hz signal at the output of the counter 30 is passed through a digital-to-sinewave converter 32 and the resultant 128hz sinewave is applied to the vertical deflection plates 34 of a cathode ray tube 36. The horizontal deflection plates 38 of the CRT 36 are also driven by a 128hz sinewave signal. This horizontal drive signal is produced by extracting a digital signal from the output of the counter 28, inverting it by an inverter 40, dividing it by a counter 42 and thence converting it to a sinewave by a digital-to-sinewave converter 44. It is to be understood that the operation of the inverter 40 and counter 42 introduces a 90° phase shift into the horizontal signal relative to the vertical signal. Thus, the sinvewave sweep signals provide a round trace on the screen 37 of the CRT 36.

The four megahertz output signal of the minus oscillator **24*a* is likewise divided to 128hz by counters 26*a*, 28*a* and 30*a*. The counter 26*a* divides the four megahertz signal to 32,768hz minus 10 ppm. The signal is then divided to 128hz by the counters 28*a* and 30*a* where it is thereupon passed through a digital-to-sinewave converter 32*a* and then supplied to the vertical deflection plates 46 of cathode ray tube 48. The horizontal plates 50 of the cathode ray tube 48 are driven by a 128hz signal developed by passing an output from the counter 28*a* through an inverter 40*a*, a counter 42*a* and a digital-to-sinewave converter 44*a***. This signal is also shifted in phase by 90° relative to the horizontal deflection signal.

The operation of the plus oscillator **24*b*, counters 26*a*, 28*b*, 30*b* and 42*b*, digital-to-analog converters 32*b* and 44*b* is identical to the master oscillator and minus oscillator subcircuits already described. The plus oscillator signal is output at 32,768hz plus 10 ppm by a counter 26*b*. A 128hz vertical deflection signal is provided thereafter by counters 28*b* and 30*b* and digital-to-analog converter 32*b* to the vertical plates 52 of a cathode ray tube 54. The 128hz horizontal deflection signal is provided from a counter 28***b* through an inverter 40*b*, a counter 42*b* and a digital-to-analog converter 44*b* to the horizontal plates 56 of the tube 54.

Three identical digital-to-analog converters 58, 58*a* and 58*b* are connected at the outputs of the counter 26, 26*a* and 26*b* respectively. These converters 58, 58*a* and 58*b* operate upon the digital pulses to provide sinusoidal outputs to distribution amplifiers 60, 60*a* and 60*b* respectively. These amplifiers provide current gain and impedance transformation suitable for distribution of the reference, plus and minus signals to each operator tuning station 14 anywhere in the factory via transmission cabling 15.

Figure 3:
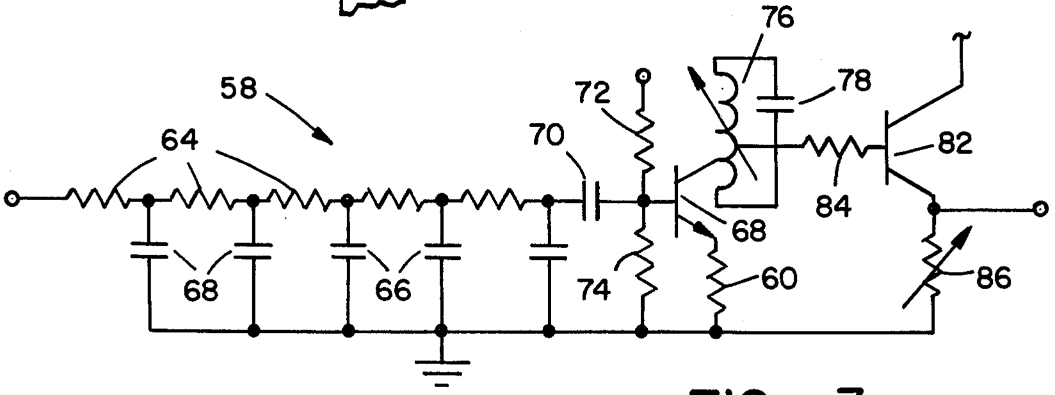
FIG. 3 is a schematic circuit diagram of the three digital-to-analog converters of the master oscillator of FIG. 2.

The digital-to-sineware converters 58, 58*a* and 58*b* operating at 32,768hz and the digital-to-sinewave converters 32, 32*a*, 32*b*, 44, 44*a*, and 44*b*, operating at 128hz are each exemplified by the circuit of FIG. 3. Each circuit includes a wave shaping network 58 of series connected resistors 64 of a preselected value. The values are selected to provide a long time constant appropriate to the operating frequency to convert the input pulses into sinewaves. The output of the network 58 is supplied to the base of a transistor 68 through a blocking capacitor 70. Resistors 72 and 74 bias the transistor 68 to operate as a class A amplifier. An inductor 76 and capacitor 78 provide a resonant circuit at the collector of transistor 68, while an emitter resistor 80 provides bias and degenerative feedback to linearize the operation of the transistor 68. An output tap on the inductor 76 provides an impedance matched input and bias voltage to the base of an emitter follower output transistor 82 through a resistor 84. A variable resistor 86 provides a variable level output to the input of the distribution amplifier or deflection plates of a cathode ray tube as the case may be.

Referring again to FIG. 2, a frequency divider chain of counters 86, 88 and 90 is connected to the output of the reference standard oscillator 16. The counters 86, 88 and 90 provide digital output signals at 3,200, 640 and 128hz respectively. A three input NAND gate 92 receives inputs from the outputs of counters 86, 88 and 90 to provide an output pulse of about 31 nanoseconds duration at a 128hz recurring rate. This pulse is inverted by an inverter 94 and is then supplied to the control grid elements 96, 98 and 100 of the three cathode ray tubes 36, 48, and 54 respectively.

A 64hz output is developed by a counter 102 and is supplied to one input of two input NAND gate 104. The other input at 64hz is provided by a counter 106 connected to the output of counter 30 in the reference standard oscillator divider chain. The NAND gate 104 provides a 64hz output signal which is fed to a phase lock loop circuit 108 which controls power supply voltage to the master oscillator 24, supplied by a power supply 110. Thus, the phase lock loop 108 phase locks the master oscillator frequency to the ten megahertz master oscillator 16. Thus, very accurate frequency control of the master oscillator 24 is achieved by the phase lock loop 48. The 64hz frequency is selected as the first available common frequency wherein the pulses are symmetrical square waves, the symmetry being required for proper operation of the phase lock loop circuit 108.

The 31 nanosecond pulse provides a stationary spot 37 on the display screen of the CRT 36 as long as the master oscillator 24 is phase locked to the standard oscillator 16. On the screens of tubes 48 and 54, the 31 nanosecond pulse generated spots rotate about a circular path very slowly, with a period of rotation being approximately 13 minutes. In the case of the minus oscillator cathode ray tube 48, the spot 49 rotates in one direction and, as would be expected, in the case of the plus oscillator CRT 54 the spot 55 rotates in an opposite direction. Thus, the cathode ray tubes 36, 48 and 54 provides a rapid visual indication that the master station 12 is functioning correctly.

Figures 4, 5:
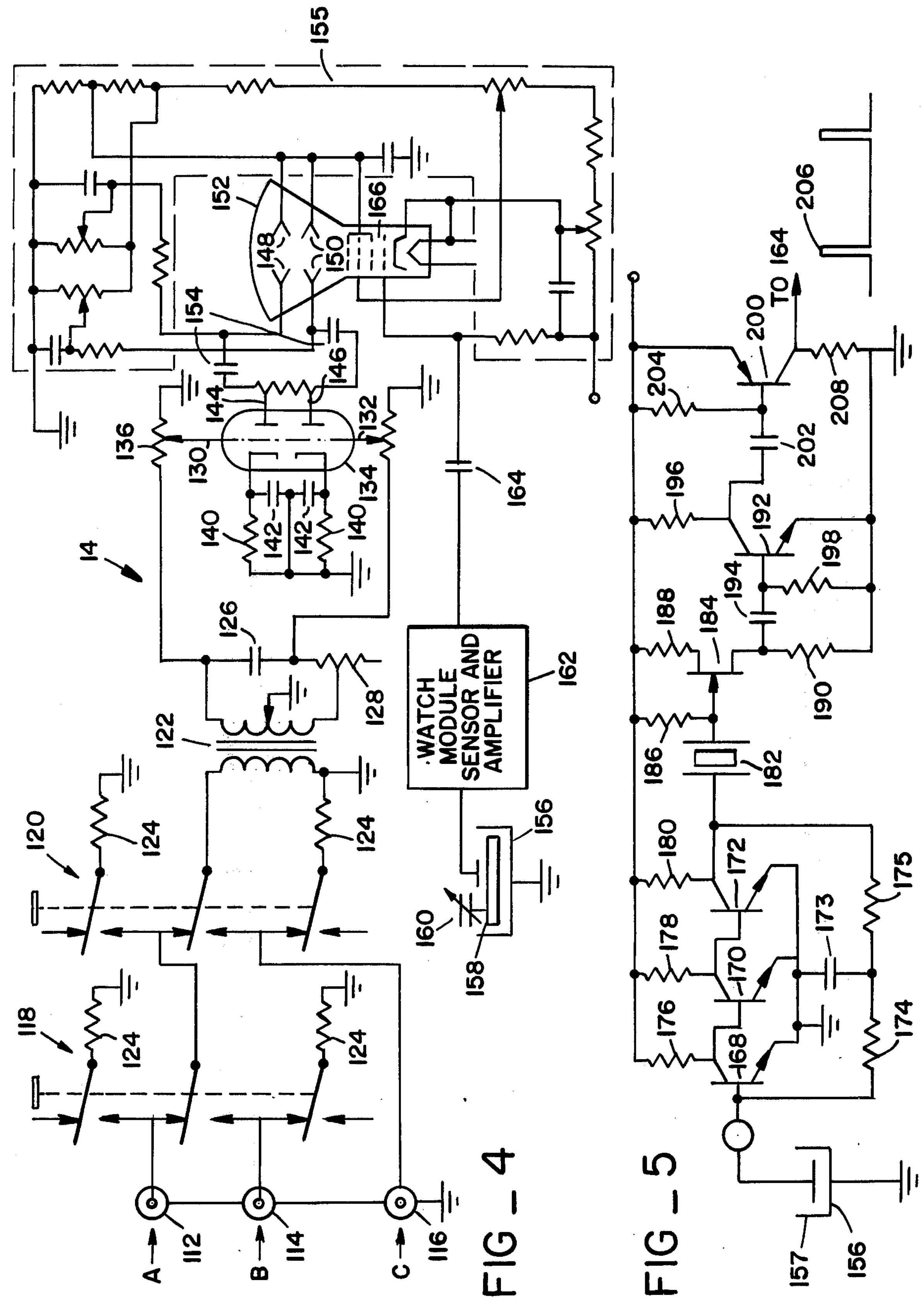
FIG. 4 is a schematic diagram of an operator tuning station of FIG. 1 with the operator station pickup amplifier shown in block diagram.
FIG. 5 is a schematic diagram of the operator station pickup amplifier of FIG. 4.

The circuitry of each operator tuning station 14 is illustrated by the schematic diagram of FIG. 4. Reference signals at 32,768hz and plus and minus 10 ppm, are received from the distribution cabling 15 via jacks 112, 114 and 116 in each operator tuning station 14. Two three-pole double-throw switches 118 and 120 are provided at each station 14 to switch the input between the master signal A at the jack 112, the minus signal B at the jack 114 and the plus signal C at the jack 116. When not applied to the input transformer 122, the signals at the jacks are terminated in suitable termination resistors 124. The selected test signal is applied to a primary winding of the transformer 122. A center tapped secondary of the transformer 122, in combination with a shunt capacitor 126 and a variable resistor 128, provides two phase-shifted drive signals $\phi 1$ and $\phi 2$, wherein the phase of $\phi 2$ is shifted by 90° with respect to $\phi 1$ by adjustment of the resistor 128.

The drive signals $\phi 1$ and $\phi 2$ are applied to the control grids 130 and 132 of a high voltage gain dual triode 134 through level setting potentiometers 136 and 138. Cathode bias for the tube 135 is provided by resistors 140. Degeneration is eliminated by bypass capacitors 142 which bypass the cathodes of the tube 134 to ground. The plates 144 and 146 of the tube 134 are connected to the horizontal deflection plates 148 and vertical deflection plates 150 of a cathode ray tube 152 through blocking capacitors 154 and provide a deflection pattern which creates a unitary circular lissajous trace on the screen of the CRT 152. The other circuitry shown within the dotted portion 155 of FIG. 4 in connection with the cathode ray tube 152 provides focusing of the electron beam and control of beam intensity to regulate the trace appearing on the screen of the tube. This circuitry 155 is well known in the art and employs conventional principles. Thus, it will not be described further.

Each operator control station includes a watch module sensor 156 for electrostatic detection of time base generator signals generated in a watch module 158 to be aligned. Each such module has a trimmer capacitor 160 which is illustrated schematically in FIG. 4. The sensed time base signal from the watch module 158 is supplied to the input of a watch module sensor and amplifier 162 wherein the signal is first greatly amplified and then selectively filtered at 32,768hz and further amplified and differentiated into a sharp pulse by the circuitry of FIG. 5 described hereinafter. The output of the watch module sensor and amplifier 162 is applied through a blocking capacitor 164 to a control grids 166 of the cathode ray tube 152. The control grid pulse signal provides a spot 153 appearing on the screen of the cathode ray tube. The spot will rotate either clockwise or counterclockwise if the clock module frequency is above or below the calibration frequency. When the watch module frequency is adjusted by an operation to coincide with the reference frequency, the spot will remain stationary or move very slowly.

Referring now to FIG. 5, the electrostatic sensor 156 may be provided with peripheral shielding 157 so that signals generated in the watch module 158 to be aligned are picked up while stray ambient signals are excluded. The sensed signals are fed through a very high gain amplifier section comprising transistors 168, 170 and 172. A large filter capacitor 173 inhibits feedback to provide very high gain; resistors 174 and 175 are selected to bias the transistors 168, 170 and 172 for class A operation; load resistors 176, 178 and 180 provide bias and impedance matching of the transistors 168, 170 and 172.

The output of the transistor 172 is passed through a narrow bandpass crystal filter 182 which establishes the bandpass characteristics of the entire unit. The crystal filter 182 is lightly loaded to the gate of a p-channel junction field effect transistor 184. High impedance at the gate is maintained by a bias resistor 186 of very high resistance on the order of 10 megohm. A source resistor 188 and a chain resistor 190 are provided to bias the field effect device 184 as a high gain class A amplifier.

The output of the transistor 184 is coupled through a blocking capacitor 194 to the base of a bipolar transistor 192, biased for class A operation by resistors 196 and 198. The collector of transistor 192 is connected to the base of a transistor 200 through a small value differentiating capacitor 202 which operates in conjunction with a resistor 204 and the base impedance of the transistor 200 to provide a sharp short duration output pulse 206. The output pulse is provided at the collector of transistor 200 across a load resistor 208 and is then sent to the control grid of the cathode ray tube 152 through the blocking capacitor 164 as explained in connection with FIG. 4.

The short duration pulse from the watch module sensor and amplifier 162 will produce a spot 152 which will rotate along a circular path on the screen of the CRT 152 as defined by the sweep voltages on the vertical and horizontal deflection plates 148 and 150. The rotation indicates the rate of phase change occuring between the frequency of the watch module 158 and the master frequency reference signal A. Adjustment of the trimmer capacitor 160 in the watch module 158 tunes the watch frequency to the reference frequency, and when that occurs, phase ceases to change between the two signals, and the spot thereupon becomes stationary.

An operator may easily determine the relative range of adjustment of the trimmer capacitor 160 of each module 158 undergoing calibration alignment. The range test is provided by the minus and plus signals B and C.

To ascertain if the capacitor 160 will adjust to a lower limit of e.g. minus 10 ppm, the operator depresses the momentary return push button switch 118 which connects the minus jack 114 to the primary winding of the transformer 122. The operator then rotates the trimmer 160 until the displays spot becomes stationary or virtually stationary. This indication establishes a running range lower limit capability of the module 158. The switch 118 is then released.

To check the upper limit, the operator depresses the momentary return push button switch 120 which connects the plus jack 116 to the transformer 122. The trimmer is again adjusted to immobilize the rotating spot. If cessation of rotation occurs or is closely approached, a tuning range upper limit capability of the module 158 is confirmed and the module is acceptable from a quality control standpoint.

Finally, the operator releases the second push button 120 which restores the correct alignment signal to the cathode ray tube sweep circuit. The trimmer is adjusted to stop the spot and the watch is thereupon calibrated. The above test procedure may then be repeated for the next watch module.

Figure 6:
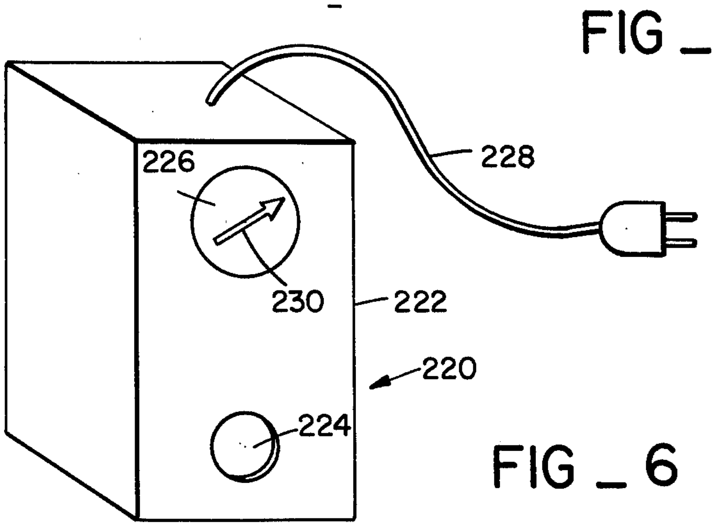
FIG. 6 is a view in perspective of another embodiment of the present invention providing a portable self-contained visual tuning-aid device for field alignment of electronic timepieces.
Figure 7:
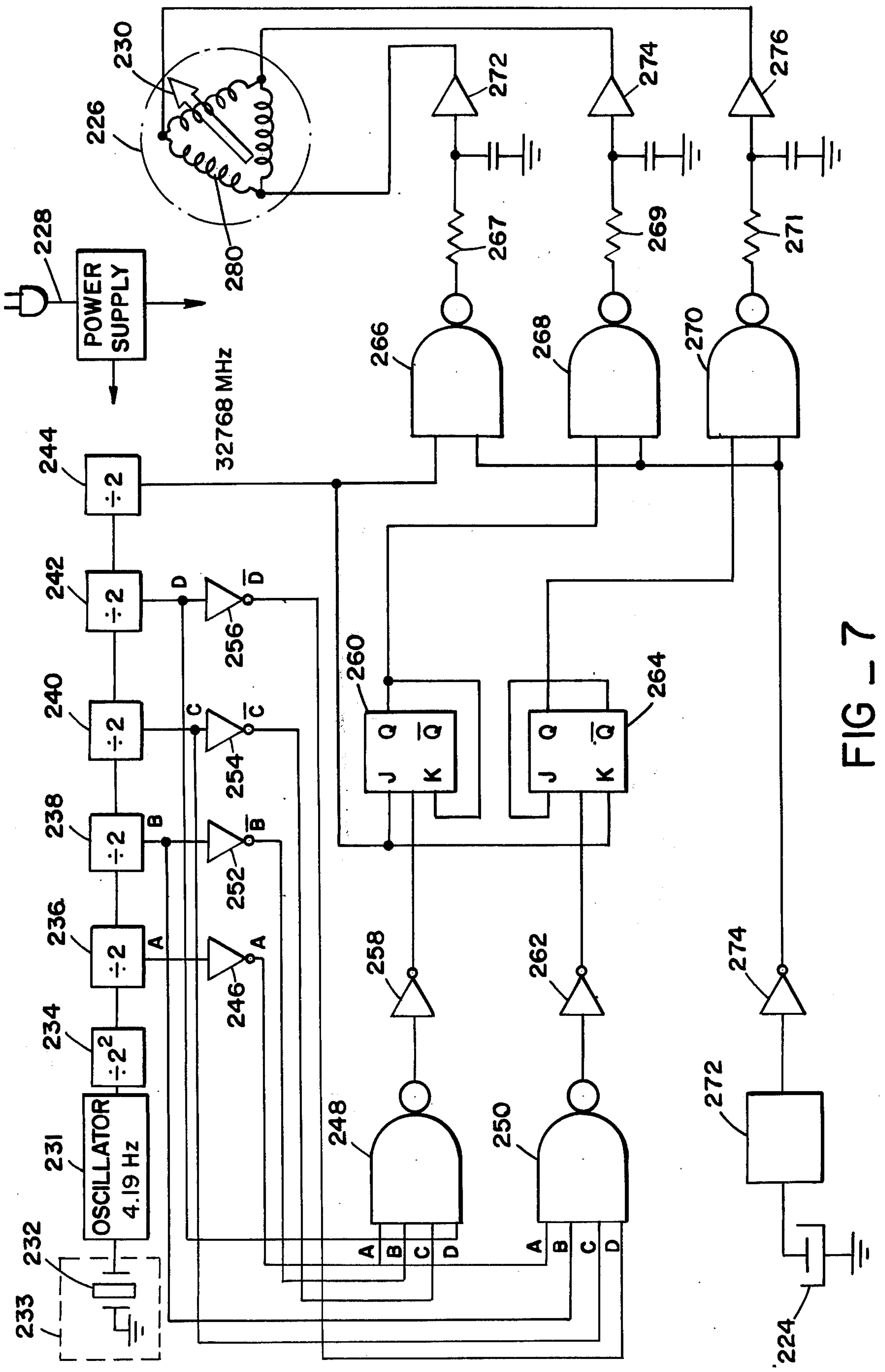
FIG. 7 is a detailed block and logic diagram of the device shown in FIG. 6.

A second preferred embodiment of the present invention is disclosed in FIGS. 6 and 7. A highly portable, self-contained frequency measuring station 220 includes a small box-like housing 222, a watch module sensor well 224, a three-phase motor driven display device 226 and a power cord 228 suitable for plugging into a standard electric current source. When line voltage is supplied to the unit 220, and an operating watch module 158 is placed in the watch module sensor well 224, an indicator needle 230 driven by the three-phase motor in the display 226 begins to rotate in one direction or the other, depending upon whether the watch module frequency is above or below a reference alignment frequency generated in the measuring station. Adjustment of the trimmer capacitor 160 in the watch module is made until the needle 230 stops rotating, thereby indicating that the frequency of the watch module 158 coincides with the frequency of the frequency measuring station 220.

The operation of the frequency measuring station 220 may be explained by reference to the block logic diagram of FIG. 7. A very stable 4.194304 megahertz oscillator 231 controlled by a temperature compensated A T cut crystal 232 provides a precise time base reference frequency. An oven 233 may be used to control the temperature of the quartz crystal 232.

The reference frequency is divided by a series of counters 234, 236, 238, 240, and 244 to produce at the output of the counter 244 a 32,768hz signal which is the basic time base frequency generated in the watch module 158 and which may be adjusted by the trimmer 160.

The output of the counter 236 is a 524khz signal which is inverted by an inverter 246 to provide an input to two four input NAND gates 248 and 250. The signal from the inverter 246 is labeled $\overline{A}$. The output of the counter 238 is a signal at 262khz and that output, labeled B, provides an input to the NAND gate 248. An inverter 252 provides an inverted input signal to the NAND gate 250 labeled $\overline{B}$.

The counter 240 provides an output signal at 131khz labeled C which is provided at the input of the NAND gate 250. An inverter 254 is also connected at the output of counter 240 and the output, labeled $\overline{C}$, of the inverter 254 provides an input to the NAND gate 248.

The output of the counter 242, labeled D, is a 65khz signal which is applied at a fourth input to the NAND gate 248. It is also inverted by an inverter 256 and applied as signal $\overline{D}$ to the fourth input of the NAND gate 250. The output of the NAND gate is applied through an inverter 258 to the clock input of J–K flip flop 260. The output of the NAND gate 250 is inverted by an inverter 262 and then applied to the clock input of J–K flip flop 264 similar to the flip flop 260. The J input of the flip flop 260 and the K input of the flip flop 264 are driven by the output signal of 32,768hz from the counter 244. The Q output of the flip flop 260 is returned to the K input of that flip flop; the $\overline{Q}$ output of the flip flop 264 is returned to the J input of that flip flop.

The 32,768hz output signal from the counter 244 is also applied to one input of a two input NAND gate 266. The Q output of the flip flop 260 is applied to one input of a two input NAND gate 268. And, the Q output of the flip flop 264 is applied to one input of a NAND gate 270. The leading edge of the pulse applied to the NAND gate 266 from the counter 244 is arbitrarily called $\phi 1$ as it is the zero reference phase pulse. The signal applied to the input of the NAND gate 268 from the flip flop 260 lags $\phi 1$ by approximately 120° and is labeled $\phi 2$. The input signal to the NAND gate 270 from the flip flop 264 lags $\phi 1$ by approximately 240° and is labeled $\phi 3$. Thus the signals $\phi 1$, $\phi 2$ and $\phi 3$ provide three phase waveforms.

A signal from a watch module 158 is detected in the sensor well 244 and is then amplified by an amplifier 272 which is identical to the amplifier described in connection with FIG. 5 except that the capacitor 212 of the apparatus of FIG. 5 is made sufficiently large so that the output waveform is a virtually symmetrical square wave rather than a sharply defined impulse. The output of the sensor amplifier 272 is inverted by an inverter 274 and thence supplied as the second input to the NAND gates 266, 268, and 270. These NAND gates function to combine the 32,768hz reference signal which has been divided into three phases and the signal at approximately the same frequency from the watch module 158 in the sensor well 224. The output signals at the NAND gates 226, 268 and 270 are series of pulses wherein the duration of each pulse varies in accordance with changing phase relationships between the watch module signal and the reference signal. Suitable integration networks 267, 269 and 271 at the outputs of the NAND gates 226, 268, 270 provide three phase waveforms which are proportional to the phase shift relationship. Suitable amplifiers 272, 274 and 276 may then be used to amplify the three phase signals to a suitable driving level and then the signals may be supplied to the field windings of 280 of a three phase motor display device 226. The armature of the device moves the rotating indicator 230 as shown in FIG. 6.

As is readily apparent, the integration of the phase shifting pulses at the delta windings 280 of the display device 226, cause the indicator needle 230 to rotate in one direction or another depending on the direction of phase shift. Adjustment of the tuning capacitor 180 in the module 158 to a point where the frequency of the module 158 coincides with the 32,768hz reference frequency at the output of counter 244 stops the phase shifting and eliminates the integrated waveform representing the phase shift. At this point, the needle 230 ceases to rotate, thereby indicating that the watch module has become aligned.

Thus, the frequency measuring station 220 provides a highly portable self-contained tuning aid for electronic watch modules operating at a predetermined time base frequency for use by jewelers and field technicians in serving and aligning the modules. The station runs on standard line voltage, is simple to operate and provides an accurate and unmistakable indication of alignment of the module.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A visual tuning aid system for aligning a time base signal generator in an electronic time piece to a correct frequency including:

reference signal generator means for generating a reference signal at a frequency integrally related to said correct frequency;

sensor means for sensing and selectively amplifying a time base signal generated by the time base signal generator in a said electronic time piece to be aligned;

phase change indicator means connected to said reference signal generator and to said sensor means for indicating by a relative movement the rate of phase change between said reference signal and said time base signal;

plus signal generator means for generating a plus signal having a frequency a predetermined small amount above said reference signal;

minus signal generator means for generating a minus signal having a frequency a predetermined small amount below said reference signal; and switch means connected to said phase change indicator means for selecting one of said reference signal, plus signal and minus signal, whereby alignment of said time base signal generator to said correct frequency eliminates said phase change; and thereupon said phase change indicator means ceases said relative movement indicating alignment of said time base signal generator to said correct frequency, and whereby tuning range of said time base generator may be ascertained by alignment thereof to said plus signal and to said minus signal.

2. The tuning aid system of claim 1 comprising a plurality of operator test stations, each station including a said sensor means and a said phase change indicator means and wherein said reference signal generator means includes reference signal distribution means connected to each said station for distributing reference signals and wherein said distribution means also distributes said plus signal and said minus signal to at least one of said test stations, and wherein at least one test station includes said switch means for selecting between said reference signal, plus signal and minus signal.

* * * * *